(12) United States Patent
Liu et al.

(10) Patent No.: US 10,418,356 B2
(45) Date of Patent: Sep. 17, 2019

(54) DIODE STRUCTURE AND ELECTROSTATIC DISCHARGE PROTECTION DEVICE INCLUDING THE SAME

(71) Applicant: NANYA TECHNOLOGY CORPORATION, New Taipei (TW)

(72) Inventors: Fang-Wen Liu, New Taipei (TW); Tseng-Fu Lu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/957,425

(22) Filed: Apr. 19, 2018

(65) Prior Publication Data

US 2019/0198492 A1 Jun. 27, 2019

Related U.S. Application Data

(60) Provisional application No. 62/608,975, filed on Dec. 21, 2017.

(51) Int. Cl.
| | |
|---|---|
| *H01L 21/70* | (2006.01) |
| *H01L 27/02* | (2006.01) |
| *H01L 29/06* | (2006.01) |
| *H01L 27/08* | (2006.01) |

(52) U.S. Cl.
CPC ...... *H01L 27/0248* (2013.01); *H01L 27/0814* (2013.01); *H01L 29/0649* (2013.01); *H01L 29/0692* (2013.01)

(58) Field of Classification Search
None
See application file for complete search history.

(56) References Cited

U.S. PATENT DOCUMENTS

| 6,111,296 A * | 8/2000 | Yamazaki | H01L 21/26506 |
| | | | 257/401 |
| 2009/0040670 A1* | 2/2009 | Van Camp | H01L 27/0255 |
| | | | 361/56 |
| 2013/0307017 A1* | 11/2013 | Chen | H01L 27/0262 |
| | | | 257/133 |

OTHER PUBLICATIONS

Taiwanese (ROC) Office Action dated Dec. 5, 2018 based on Application No. 107120563 with English Translation.

* cited by examiner

*Primary Examiner* — Calvin Y Choi
(74) *Attorney, Agent, or Firm* — Muncy, Geissler, Olds & Lowe, P.C.

(57) ABSTRACT

The present disclosure provides a diode structure and an electrostatic discharge (ESD) protection circuit including the same. The diode structure includes a P-type substrate. The diode structure further includes a plurality of wavy N-doping regions formed on the P-type substrate. Each of the wavy N-doping regions extends in a first direction and has an N-doping width in a second direction perpendicular to the first direction. The diode structure further includes a plurality of wavy P-doping regions formed on the P-type substrate. Each of the wavy P-doping regions extends in the first direction and has a P-doping width in the second direction. The N-doping widths are essentially identical at different positions along the first direction, and the P-doping widths are essentially identical at different positions along the first direction.

21 Claims, 8 Drawing Sheets

DIODE STRUCTURE AND ELECTROSTATIC DISCHARGE PROTECTION DEVICE INCLUDING THE SAME

PRIORITY CLAIM AND CROSS-REFERENCE

This patent application claims priority to U.S. patent application Ser. No. 62/608,975, filed on Dec. 21, 2017, which is incorporated by reference in its entirety.

TECHNICAL FIELD

The present disclosure relates to a diode structure and an electrostatic discharge (ESD) protection device including the same, and more particularly, to a diode structure with highly robust ESD protection for high-speed I/O applications and an ESD protection device including the same.

DISCUSSION OF THE BACKGROUND

In order to effectively protect internal circuits and to minimize the parasitic effects of CMOS input/output (I/O) electrostatic discharge (ESD) protection circuits, the dual-diode ESD protection has been widely adopted for effective on-chip ESD protection.

As IC dimensions are reduced with advancing technology, ESD protection devices will continue to become smaller and smaller. In order to take advantage of the dimension reductions without excessive diminishing of ESD performance, many diode structure design approaches have been proposed. For example, change the length of the diode structure, the width of the doping regions, the depth or spacing of the shallow trench isolation (STI), and other approaches. However, the ESD failure current increases with increases in the length of the diode structure, the width of the doping regions.

Therefore, a diode structure with highly robust ESD protection for high-speed I/O applications is desired.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

The present disclosure provides a diode structure. The diode structure comprises a P-type substrate. The diode structure further comprises a plurality of wavy N-doping regions formed on the P-type substrate. Each of the wavy N-doping regions is in the form of a parallel wavy line that extends in a first direction and has an N-doping width in a second direction perpendicular to the first direction. The diode structure further comprises a plurality of wavy P-doping regions formed on the P-type substrate. Each of the wavy P-doping regions is in the form of a parallel wavy line that extends in the first direction and has a P-doping width in the second direction. The N-doping widths are essentially identical at different positions along the first direction, and the P-doping widths are essentially identical at different positions along the first direction.

In some embodiments, the plurality of wavy N-doping regions and the plurality of wavy P-doping regions are sandwiched by a pair of side doping regions extending in the second direction.

In some embodiments, the plurality of wavy N-doping regions are connected to the pair of side doping regions, and the pair of side doping regions are N-doped.

In some embodiments, the plurality of wavy P-doping regions are connected to the pair of side doping regions, and the pair of side doping regions are P-doped.

In some embodiments, the N-doping widths and the P-doping widths are essentially identical.

In some embodiments, the plurality of wavy N-doping regions and the plurality of wavy P-doping regions are arranged in an alternating manner in the second direction.

In some embodiments, the diode structure further comprises a plurality of shallow trench isolations (STI) formed between the plurality of wavy N-doping regions and the plurality of wavy P-doping regions.

In some embodiments, the diode structure further comprises an N well located above the P-type substrate and beneath the plurality of wavy N-doping regions and the plurality of wavy P-doping regions.

In some embodiments, the diode structure further comprises a deep N well located above the P-type substrate and beneath the N well.

In some embodiments, the N well is highly doped compared with the deep N well.

The present disclosure also provides an electrostatic discharge (ESD) protection circuit. The ESD protection circuit comprises the diode structure of the present disclosure. The ESD protection circuit further comprises an input/output terminal of a circuit under protection electrically connected to a first wavy P-doping region and a first wavy N-doping region. The ESD protection circuit further comprises a first node electrically connected to a second wavy N-doping region. The ESD protection circuit further comprises a second node electrically connected to a second wavy P-doping region.

In some embodiments, the first node is a positive power node wherein the first wavy P-doping region and the second wavy N-doping region constitute a PN ESD diode.

In some embodiments, the second node is a negative power node wherein the first wavy N-doping region and the second wavy P-doping region constitute an NP ESD diode.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description.

FIGS. 1A and 1B are schematic diagrams illustrating a comparative embodiment of diode structure for electrostatic discharge (ESD) protection, wherein FIG. 1B is a cross-sectional view taken along line X-X' of FIG. 1A.

FIGS. 2A and 2B are schematic diagrams illustrating a diode structure for ESD protection in accordance with some embodiments of the present disclosure, wherein FIG. 2B is a cross-sectional view taken along line X-X' of FIG. 2A.

FIGS. 3A and 3B are schematic diagrams illustrating another diode structure for ESD protection in accordance with some embodiments of the present disclosure, wherein FIG. 3B is a cross-sectional view taken along line X-X' of FIG. 3A.

FIGS. 4A and 4B are schematic diagrams illustrating a diode structure with an N well for ESD protection in accordance with some embodiments of the present disclosure, wherein FIG. 4B is a cross-sectional view taken along line X-X' of FIG. 4A.

FIGS. 5A and 5B are schematic diagrams illustrating a diode structure with an N well and a deep N well for ESD protection in accordance with some embodiments of the present disclosure, wherein FIG. 5B is a cross-sectional view taken along line X-X' of FIG. 5A.

DETAILED DESCRIPTION

Figure 1A:
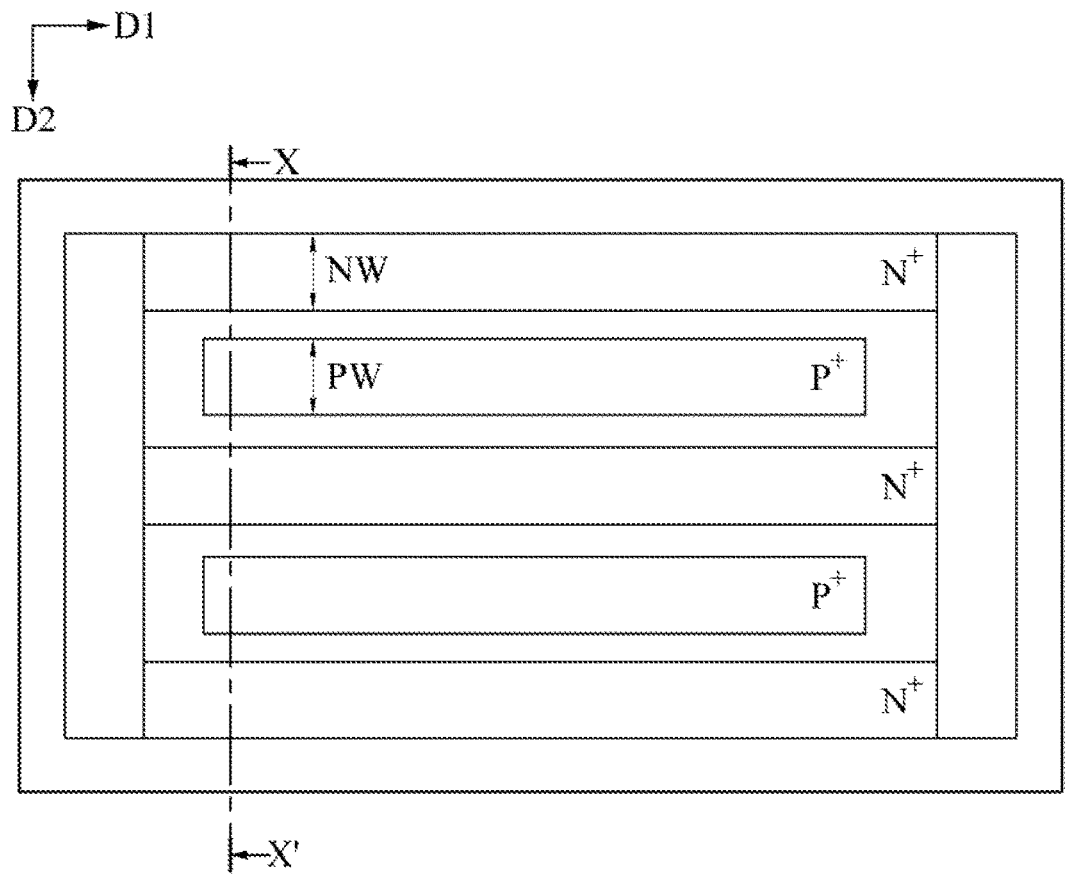

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1B:
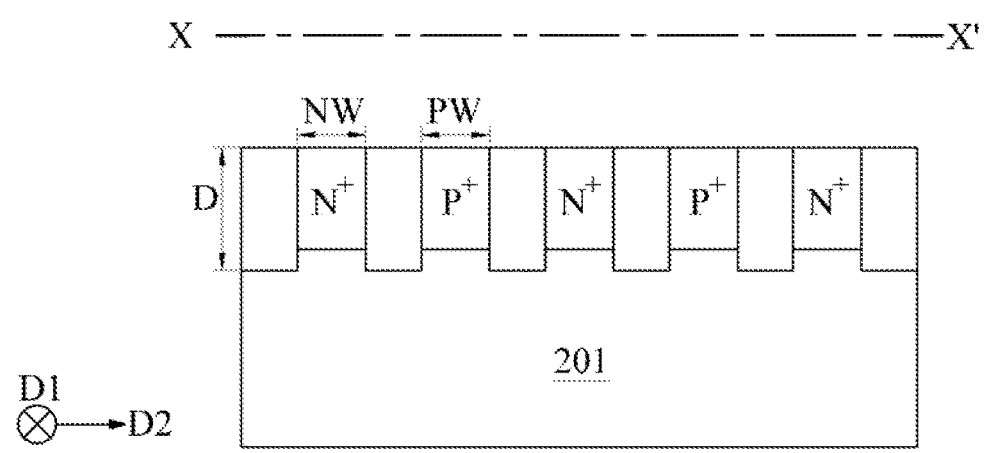

FIGS. 1A and 1B are schematic diagrams illustrating a comparative embodiment of diode structure for electrostatic discharge (ESD) protection, wherein FIG. 1B is a cross-sectional view taken along line X-X' of FIG. 1A. Referring to FIGS. 1A and 1B, the doping regions indicated with $P^+$ and $N^+$ are straight and extend in the first direction D1.

Figure 2A:
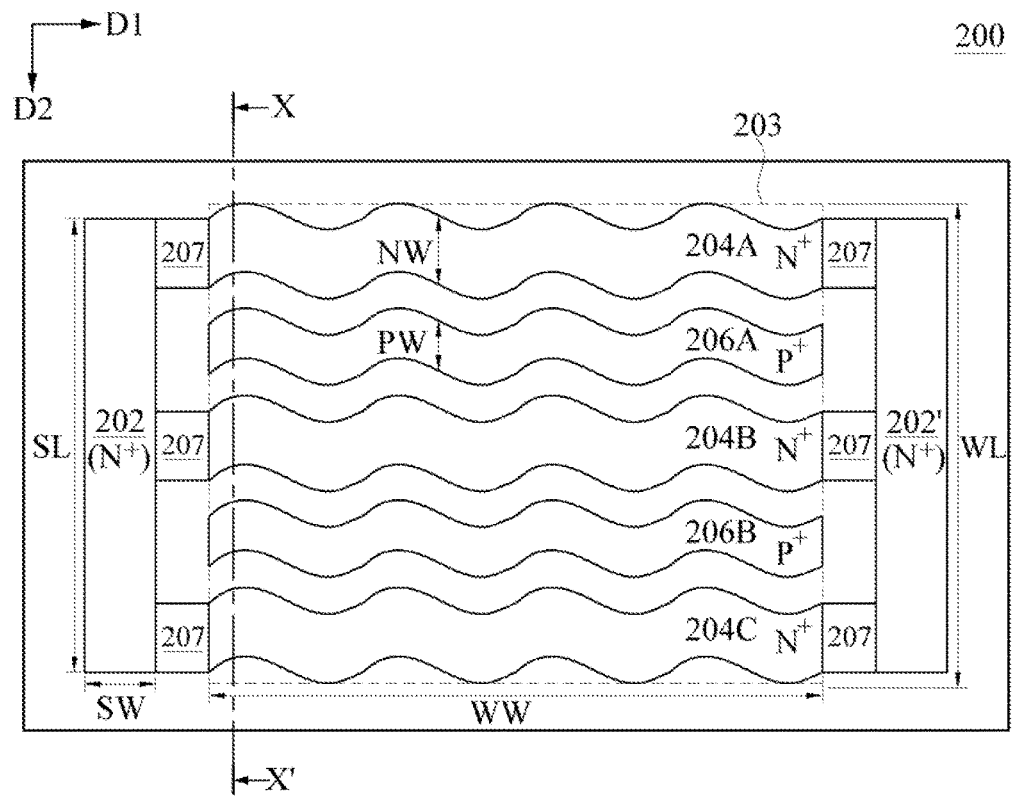
Figure 2B:
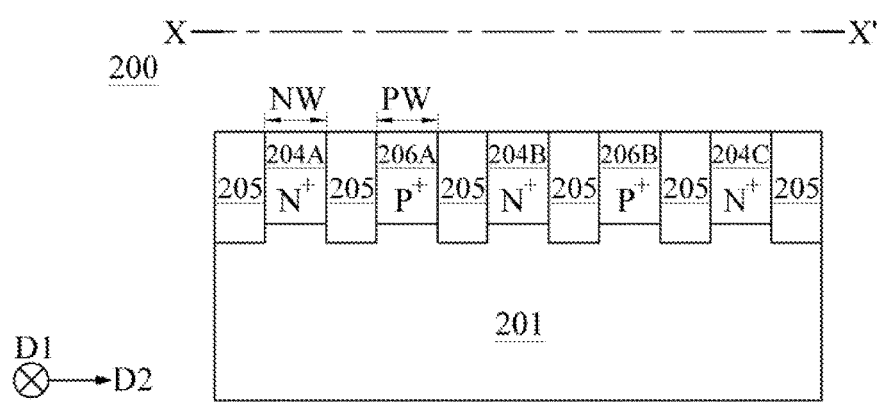

FIGS. 2A and 2B are schematic diagrams illustrating a diode structure 200 for ESD protection in accordance with some embodiments of the present disclosure, wherein FIG. 2B is a cross-sectional view taken along line X-X' of FIG. 2A.

Referring to FIG. 2B, the diode structure 200 has a P-type substrate 201. Throughout the description, the P-type or P-doping region is a region doped with trivalent impurities, for example but not limited to, boron B, aluminum (Al), and gallium (Ga), as is known in the art of semiconductor manufacturing. Besides, the N-type or N-doping region is a region doped with pentavalent impurities, for example but not limited to, phosphorus (P), arsenic (As), and antimony (Sb), as is known in the art of semiconductor manufacturing.

Referring to FIG. 2A, the diode structure 200 has a pair of side N-doping regions 202 and 202' and a wavy portion 203 sandwiched by the pair of side N-doping regions 202 and 202'.

As shown in FIG. 2A, the pair of side N-doping regions 202 and 202' have a width SW in a first direction D1 and a length SL in a second direction D2 perpendicular to the first direction. In addition, the wavy portion 203 has a width WW in the first direction D1 and a length WL in the second direction D2. In some embodiments of the present disclosure, the length SL is identical to the length WL, but the disclosure is not limited thereto.

Still referring to FIG. 2A, in some embodiments of the present disclosure, the pair of side N-doping regions 202 and 202' are straight and extend in the second direction D2.

Still referring to FIG. 2A, a plurality of connecting portions 207 are connected between the side N-doping region 202 and the wavy portion 203. In addition, the plurality of connecting portions 207 are N-doped. It should be understood that although the plurality of connecting portions 207 are straight, as shown in FIG. 2A, the disclosure is not limited thereto. In some embodiments of the present disclosure, the wavy portion 203 is connected to the side N-doping region 202 directly. Similarly, a plurality of connecting portions 207 are connected between the side N-doping region 202' and the wavy portion 203. Similar details are omitted in the interest of brevity.

Referring to FIGS. 2A and 2B, the wavy portion 203 comprises a plurality of wavy N-doping regions 204A to 204C and a plurality of wavy P-doping regions 206A and 206B. Furthermore, the pair of side N-doping regions 202 and 202' are connected to the wavy portion 203 at the plurality of wavy N-doping regions 204A to 204C. It should be noted that the plurality of wavy P-doping regions 206A and 206B are not connected to the pair of side N-doping regions 202 and 202'.

Still referring to FIGS. 2A and 2B, it should be understood that although there are three wavy N-doping regions 204A to 204C in the wavy portion 203 as illustrated in the figures for simplicity of explanation, any number of the wavy N-doping regions may be formed, as will be apparent to one of ordinary skill in the art upon consideration of the present disclosure. Also, it should be understood that although there are two wavy P-doping regions 206A and 206B in the wavy portion 203 as illustrated in the figures for simplicity of explanation, any number of the wavy P-doping regions may be formed, as will be apparent to one of ordinary skill in the art upon consideration of the present disclosure.

Still referring to FIGS. 2A and 2B, each of the wavy N-doping regions 204A to 204C is in the form of a parallel wavy line that extends in the first direction D1 and has an N-doping width NW in the second direction D2. Similarly, each of the wavy P-doping regions 206A and 206B is in the form of a parallel wavy line that extends in the first direction D1 and has a P-doping width PW in the second direction D2. The shapes of the wavy N-doping regions 204A to 204C and the shapes of the wavy P-doping regions 206A and 206B are essentially identical, but the widths NW may be different from the widths PW.

Still referring to FIGS. 2A and 2B, in some embodiments of the present disclosure, the N-doping widths NW and the P-doping widths PW are essentially identical, but the disclosure is not limited thereto. For example, the N-doping widths NW may be greater than or less than the P-doping widths PW to improve electrical conduction. For example, maximizing the junction perimeter (such as the perimeter of the wavy N-doping regions 204A) and minimizing the junction area (such as the area of the wavy N-doping regions 204A) can enhance current-handling capability thereby improve electrical conduction.

Still referring to FIGS. 2A and 2B, the N-doping widths NW are essentially identical at different positions along the first direction D1. Similarly, the P-doping widths PW are essentially identical at different positions along the first direction D1. For example, the cross-sectional views taken at points along line X-X' in the range of the wavy portion, width WW are essentially identical, wherein the line X-X' is perpendicular to the first direction D1.

Still referring to FIGS. 2A and 2B, in some embodiments of the present disclosure, the plurality of wavy N-doping regions 204A to 204C and the plurality of wavy P-doping regions 206A and 206B are arranged in an alternating manner in the second direction.

Referring to FIG. 2B, in some embodiments of the present disclosure, a plurality of shallow trench isolations (STI) 205 are formed between the wavy N-doping regions 204A to 204C and the wavy P-doping regions 206A and 206B to prevent electric current leakage between thereof. In semiconductor technologies, the STI-regions are used to define the anode region as well as the cathode region of the diode structure. In some embodiments of the present disclosure, the plurality of STI 205 surround the plurality of the wavy P-doping regions 206A and 206B.

It is known by those skilled in the art that the figures of merits (FOMs) of the ESD diodes can be valued by the ratio of junction perimeter to junction area. Referring to FIGS. 1A and 2A, it should be easily realized by those skilled in the art that the perimeter of the diode structure 200 in FIG. 2A is longer than the perimeter of the comparative diode structure in FIG. 1A, thereby resulting in improved current-handling capability. Referring to FIGS. 1B and 2B, as can be seen, the side views of the diode structure 200 and the comparative diode structure in FIG. 1A are the same, which indicates that the junction areas of the two structures are equal. Therefore, the FOMs of the diode structure 200 of the present disclosure are better than those of the comparative diode structure in FIG. 1A under the same layout area.

Figure 3A:
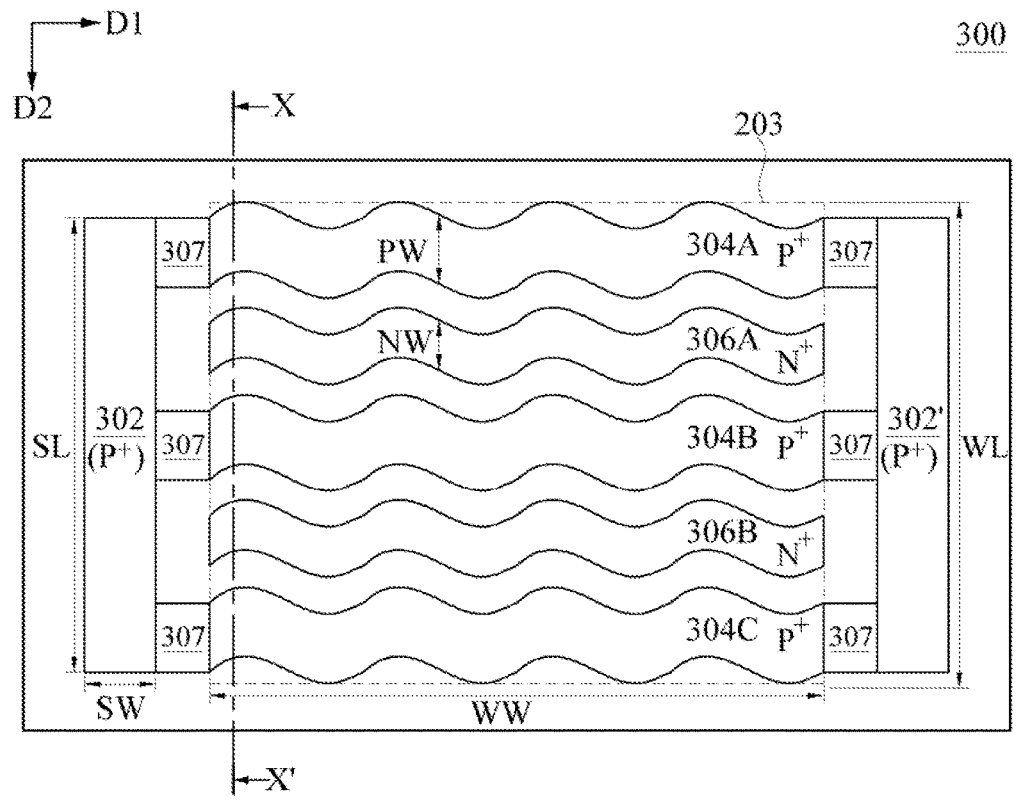
Figure 3B:
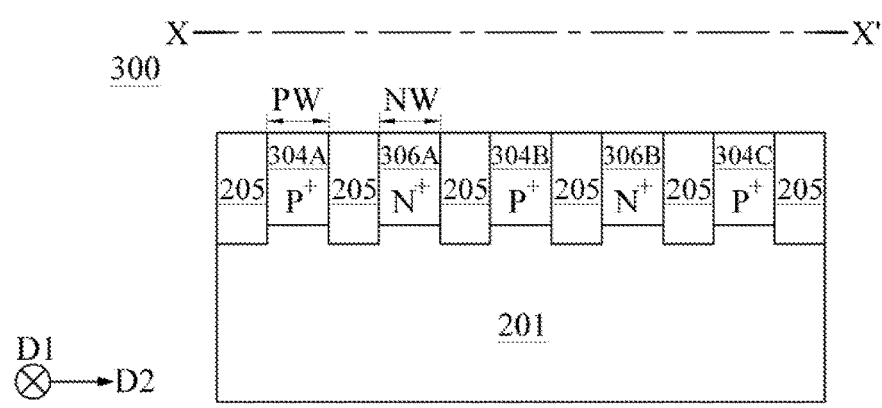

It is to be noticed that the doping agents can be interchanged, as is known in the art of semiconductor manufacturing, as further illustrated in FIGS. 3A and 3B.

FIGS. 3A and 3B are schematic diagrams illustrating another diode structure 300 for ESD protection in accordance with some embodiments of the present disclosure, wherein FIG. 3B is a cross-sectional view taken along line X-X' of FIG. 3A.

Referring to FIG. 3B, the diode structure 300 has a P-type substrate 201. Referring to FIG. 3A, in addition, the diode structure 300 has a pair of side P-doping regions 302 and 302' and a wavy portion 203 sandwiched between the pair of side P-doping regions 302 and 302'.

As shown in FIG. 3A, the pair of side P-doping regions 302 and 302' have a width SW in a first direction D1 and a length SL in a second direction D2 perpendicular to the first direction. In addition, the wavy portion has a width WW in the first direction D1 and a length WL in the second direction D2. In some embodiments of the present disclosure, the length SL is identical to the length WL, but the disclosure is not limited thereto.

Still referring to FIG. 3A, in some embodiments of the present disclosure, the pair of side P-doping regions 302 and 302' are straight and extend in the second direction D2.

Still referring to FIG. 3A, a plurality of connecting portions 307 are connected between the pair of side P-doping regions 302 and 302' and the wavy portion 203. In addition, the plurality of connecting portions 307 are P-doped. In some embodiments of the present disclosure, the wavy portion 203 is connected to the pair of side P-doping region 302 and 302' directly.

Still referring to FIGS. 3A and 3B, the wavy portion 203 comprises a plurality of wavy N-doping regions 306A and 306B and a plurality of wavy P-doping regions 304A to 304C. The plurality of wavy N-doping regions 306A and 306B are not connected to the pair of side P-doping regions 302 and 302'. The plurality of wavy P-doping regions 304A to 304C are connected to the pair of side P-doping regions 302 and 302'.

Still referring to FIGS. 3A and 3B, as mentioned above, any number of the wavy N-doping regions and the wavy P-doping regions may be formed, as will be apparent to one of ordinary skill in the art upon consideration of the present disclosure.

Still referring to FIGS. 3A and 3B, each of the wavy N-doping regions 306A and 306B is in the form of a parallel wavy line that extends in the first direction D1 and has an N-doping width NW in the second direction D2. Similarly, each of the wavy P-doping regions 304A to 304C is in the form of a parallel wavy line that extends in the first direction D1 and has a P-doping width PW in the second direction D2. The shapes of the wavy N-doping regions 306A and 306B and the shapes of the wavy P-doping regions 304A to 304C are essentially identical, but the widths NW and the widths PW may be different.

Still referring to FIGS. 3A and 3B, in some embodiments of the present disclosure, the N-doping widths NW and the P-doping widths PW are essentially identical, but the disclosure is not limited thereto. For example, the N-doping widths NW may be greater than or less than the P-doping widths PW to improve electrical conduction, as mentioned above.

Still referring to FIGS. 3A and 3B, the N-doping widths NW are essentially identical at different positions along the first direction D1. Similarly, the P-doping widths PW are essentially identical at different positions along the first direction D1. For example, the cross-sectional views taken at different positions along line X-X' in the range of the wavy portion width WW are essentially identical, wherein the line X-X' is perpendicular to the first direction D1.

Still referring to FIGS. 3A and 3B, in some embodiments of the present disclosure, the plurality of wavy N-doping regions 306A and 306B and the plurality of wavy P-doping regions 304A to 304C are arranged in an alternating manner in the second direction.

Referring to FIG. 3B, in some embodiments of the present disclosure, a plurality of STI 205 are formed between the plurality of wavy N-doping regions 306A and 306B and the plurality of wavy P-doping regions 304A to 304C to prevent electric current leakage between thereof. In some embodiments of the present disclosure, the plurality of STI 205 surround the plurality of wavy N-doping regions 306A and 306B.

As with the diode structure 200, the FOMs of the diode structure 300 of the present disclosure are better than those of the comparative diode structure in FIG. 1A under the same layout area.

Figure 4A:
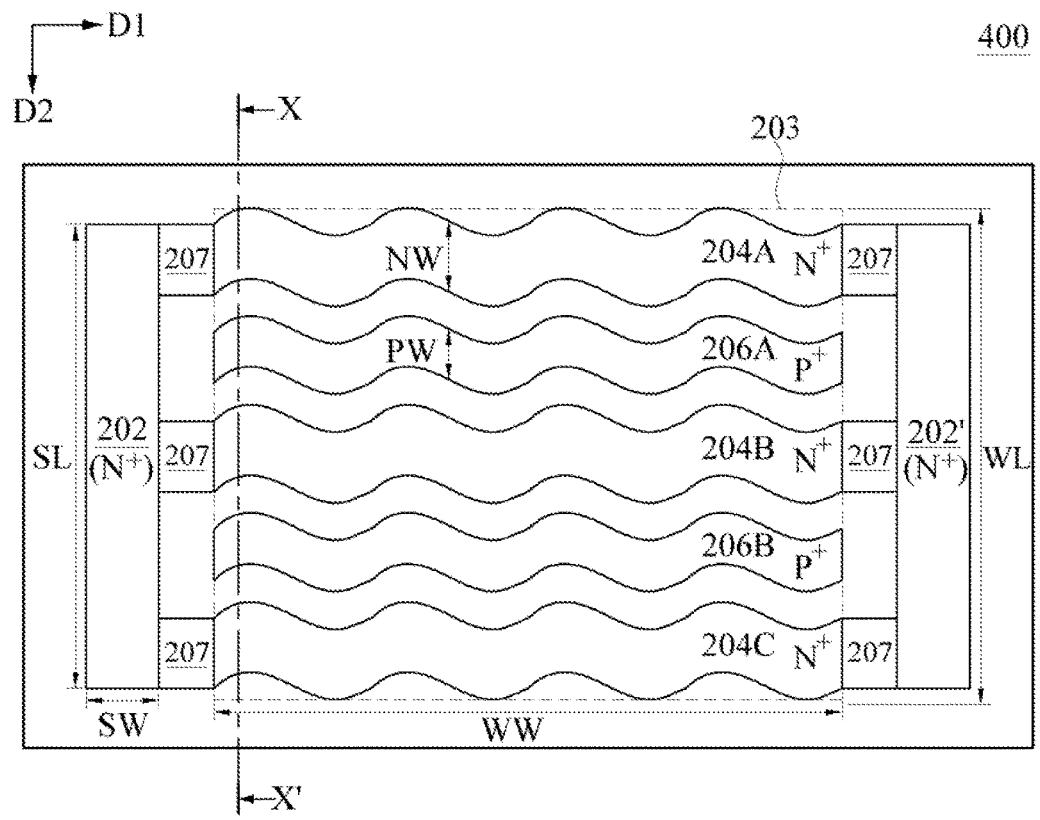
Figure 4B:
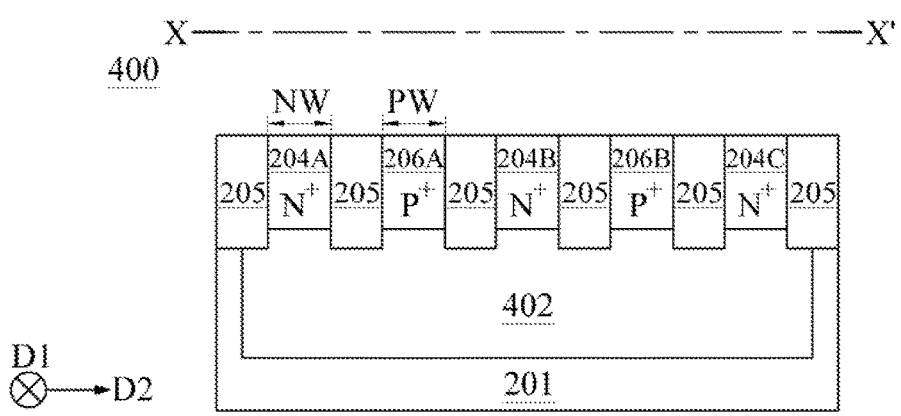

FIGS. 4A and 4B are schematic diagrams illustrating a diode structure 400 with an N well 402 for ESD protection in accordance with some embodiments of the present disclosure, wherein FIG. 4B is a cross-sectional view taken along line X-X' of FIG. 4A. Since the diode structure 400 is similar to that described above in relation to FIGS. 2A and 2B, the identical numbers represent similar components for simplicity of explanation. Such similar components are omitted in the interest of brevity, and only the differences are provided.

Referring to FIG. 4B, compared with the diode structure 200, the diode structure 400 further comprises the N well 402. The N well 402 serve as a region to isolate the plurality of doping regions from the P-type substrate 201. In addition, the N well 402 is located above the P-type substrate 201, beneath the plurality of wavy N-doping regions 204A to 204C and beneath the plurality of wavy P-doping regions 206A and 206B.

In semiconductor technologies, it is known that the doping concentration, energy, dose and perimeter structures of the isolation wells (such as the N well 402) can have a strong influence on the ESD robustness of a semiconductor device. ESD experimental results show that the increasing in sheet resistance of the N well leads to discharge of current to the P substrate during an ESD event. In other words, with a proper N well, the current-handling capability of the ESD protection can be improved.

Figure 5A:
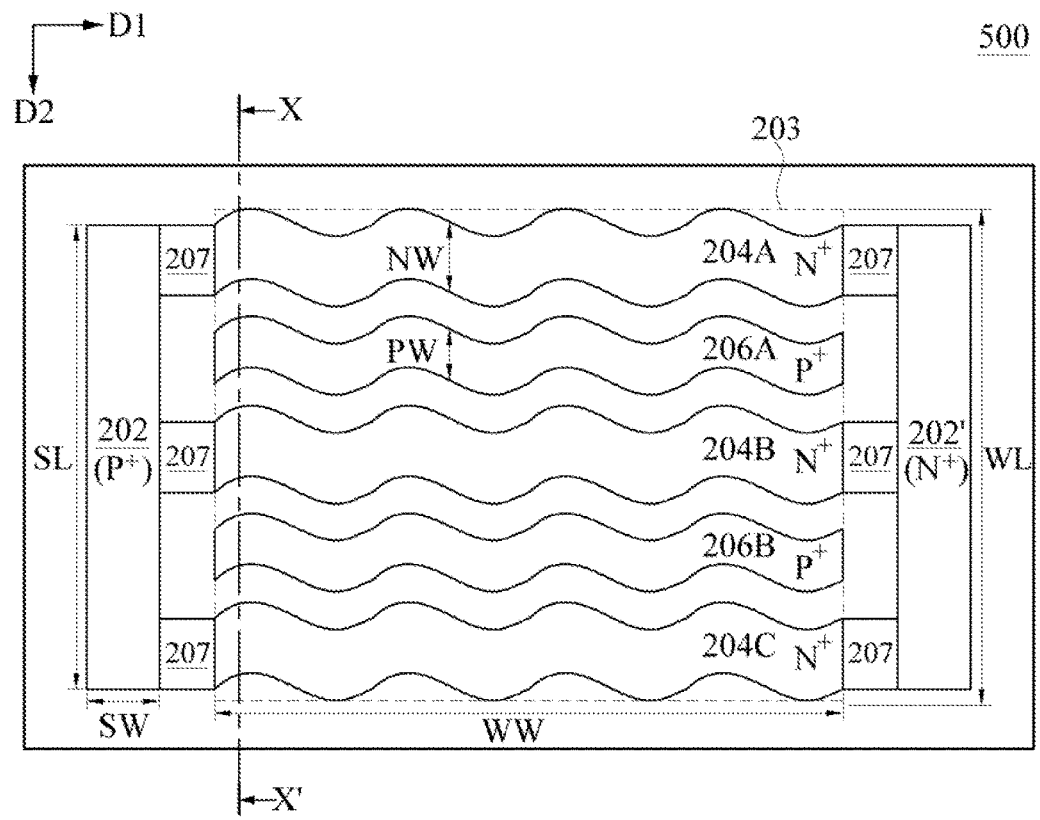
Figure 5B:
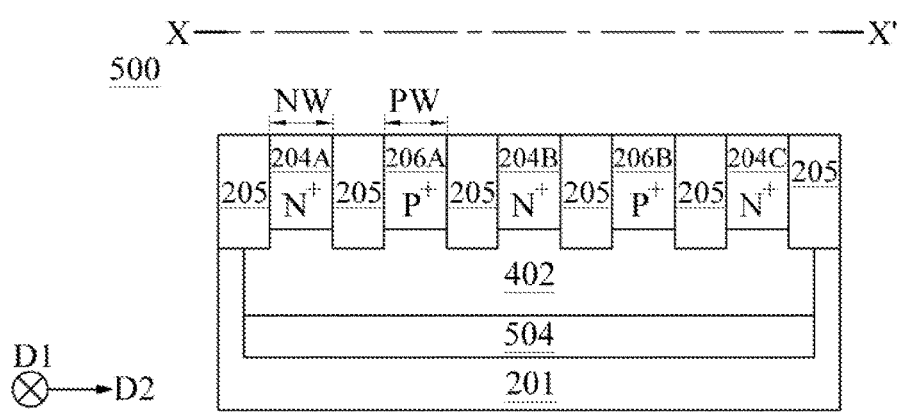

FIGS. 5A and 5B are schematic diagrams illustrating a diode structure 500 with the N well 402 and a deep N well 504 for ESD protection in accordance with some embodiments of the present disclosure, wherein FIG. 5B is a cross-sectional view taken along line X-X' of FIG. 5A. Since the diode structure 500 is similar to that described above in relation to FIGS. 4A and 4B, the identical numbers represent similar components for simplicity of explanation. Such similar components are omitted in the interest of brevity, and only the differences are provided.

Referring to FIGS. 5B and 5B, compared with the diode structure 400, the diode structure 500 further comprises the deep N well 504. In addition, the deep N well 504 is located above the P-type substrate 201 and beneath the N well 402.

The deep N well 504 is deeper in position than the N well 402, and the N well 402 is highly doped compared with the deep N well 504. The deep N well 504 and the N well 402 together provide a better isolation from the P-type substrate 201, which may also improve the current-handling capability of the ESD protection.

As mentioned above, the doping agents in the diode structure 400 and the diode structure 500 can also be interchanged, as is known in the art of semiconductor manufacturing.

Figure 6A:
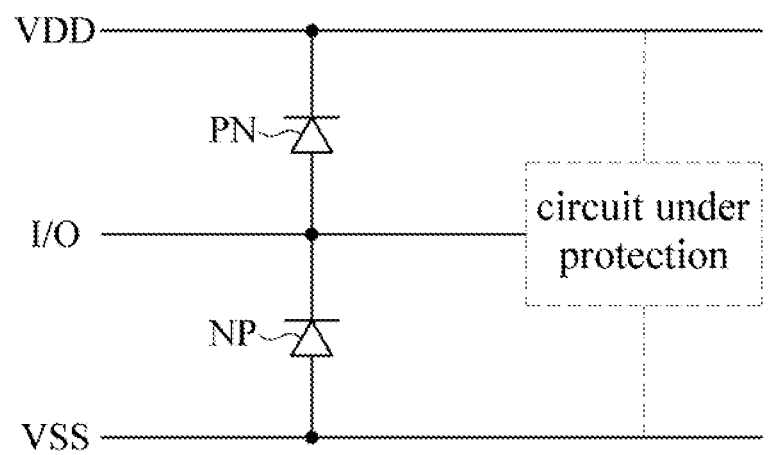
FIG. 6A is an equivalent circuit diagram of the ESD protection circuit in accordance with some embodiments of the present disclosure.
Figure 6B:
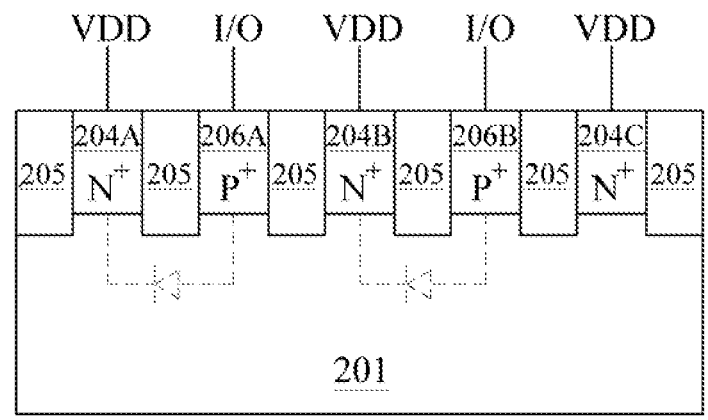
FIG. 6B is a cross-sectional view illustrating a PN ESD protection circuit in FIG. 6A in accordance with some embodiments of the present disclosure.
Figure 6C:
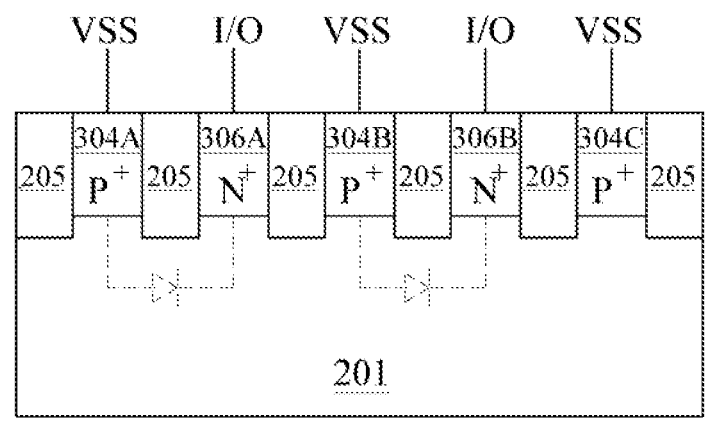
FIG. 6C is a cross-sectional view illustrating an NP ESD protection circuit in FIG. 6A in accordance with some embodiments of the present disclosure.

FIG. 6A is an equivalent circuit diagram of the ESD protection circuit in accordance with some embodiments of the present disclosure. FIG. 6B is a cross-sectional view illustrating a PN ESD protection circuit in FIG. 6A in accordance with some embodiments of the present disclosure. FIG. 6C is a cross-sectional view illustrating an NP ESD protection circuit in FIG. 6A in accordance with some embodiments of the present disclosure.

Referring to FIGS. 6B and 6C, the diode structures 200 and 300 are applied in the ESD protection circuit, while other diode structures can also be applied in the same way, such as the diode structure 400 with the N well 402, and the diode structure 500 with the N well 402 and the deep N well 504.

Referring to FIG. 6B, the wavy N-doping region 204A is electrically connected to a first node VDD. The wavy P-doping region 206A is electrically connected to an input/output terminal I/O of a circuit under protection. In some embodiments of the present disclosure, the wavy N-doping region 204A and the wavy P-doping region 206A are geometrically adjacent to each other. In some embodiments of the present disclosure, the first node VDD is a positive power node, and the wavy N-doping region 204A and the wavy P-doping region 206A constitute a PN ESD diode.

Referring to FIG. 6C, the wavy P-doping region 304A is electrically connected to a second node VSS. The wavy N-doping region 306A is electrically connected to an input/output terminal I/O of the circuit under protection. In some embodiments of the present disclosure, the wavy P-doping region 304A and the wavy N-doping region 306A are geometrically adjacent to each other. In some embodiments of the present disclosure, the second node VSS is a negative power node, and the wavy P-doping region 304A and the wavy N-doping region 306A constitute an NP ESD diode.

Figure 7:
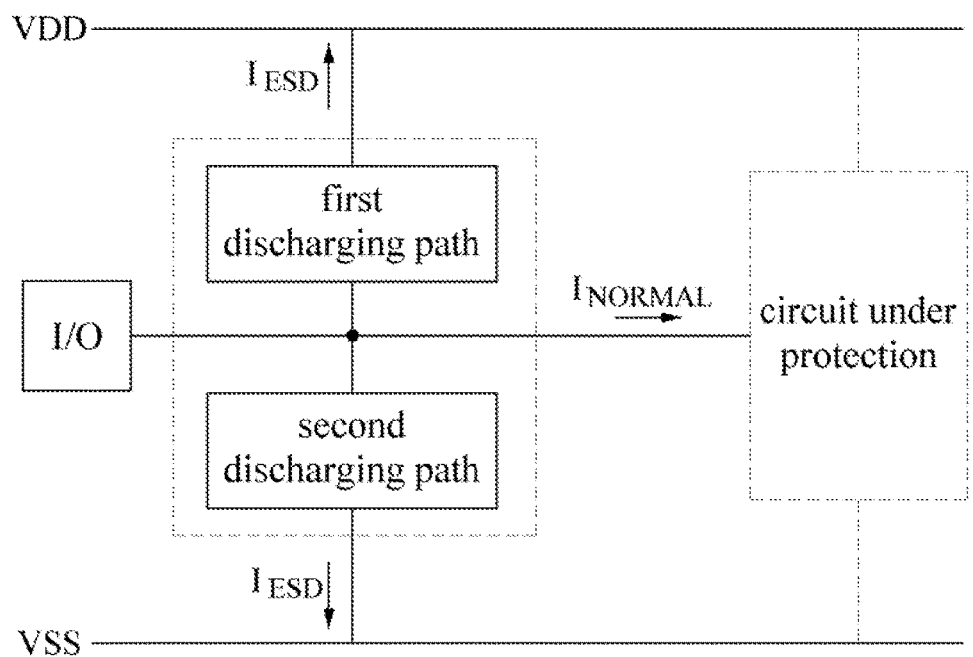
FIG. 7 is a circuit diagram in accordance with some embodiments of the present disclosure.

FIG. 7 is a circuit diagram in accordance with some embodiments of the present disclosure. Referring to FIG. 7, when an ESD event occurs at the input/output terminal I/O, the voltage difference between the input/output terminal I/O and the first node VDD is greater than the threshold voltage of the first discharging path (for example, the PN ESD diode in FIG. 6A), and the first discharging path is in an ON state and bypasses the electrostatic current $I_{ESD}$ to the first node VDD. At the same time, the voltage difference between the input/output terminal I/O and the second node VSS is greater than the activation voltage of the second discharging path (for example, the NP ESD diode in FIG. 6A), and the second discharging path is in an ON state and bypasses the electrostatic current $I_{ESD}$ to the second node VSS.

Still referring to FIG. 7, under normal operation of the circuit under protection, voltage potential differences in the first and second discharging path are below the activation voltages. The first and second discharging paths are in an OFF state, and an operation current $I_{NORMAL}$ is directly inputted into the circuit under protection.

The present disclosure provides a diode structure. The diode structure comprises a P-type substrate. The diode structure further comprises a plurality of wavy N-doping regions formed on the P-type substrate. Each of the wavy N-doping regions extends in a first direction and has an N-doping width in a second direction perpendicular to the first direction. The diode structure further comprises a plurality of wavy P-doping regions formed on the P-type substrate. Each of the wavy P-doping regions extends in the first direction and has a P-doping width in the second direction. The N-doping widths are essentially identical at different positions along the first direction, and the P-doping widths are essentially identical at different positions along the first direction.

The present disclosure also provides an electrostatic discharge (ESD) protection circuit. The ESD protection circuit comprises the diode structure of the present disclosure. The ESD protection circuit further comprises an input/output terminal of a circuit under protection electrically connected to a first wavy P-doping region and a first wavy N-doping region. The ESD protection circuit further comprises a first node electrically connected to a second wavy N-doping region. The ESD protection circuit further comprises a second node electrically connected to a second wavy P-doping region.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A diode structure, comprising:
   a P-type substrate;
   a plurality of wavy N-doping regions formed on the P-type substrate, wherein each of the wavy N-doping regions is in the form of a parallel wavy line that extends in a first direction and has an N-doping width in a second direction perpendicular to the first direction; and
   a plurality of wavy P-doping regions formed on the P-type substrate, wherein each of the wavy P-doping regions is in the form of a parallel wavy line that extends in the first direction and has a P-doping width in the second direction, wherein each of the wavy P-doping regions has no connection with each of the wavy N-doping regions;
   wherein the N-doping widths are essentially identical at different positions along the first direction, and the P-doping widths are essentially identical at different positions along the first direction;
   wherein the plurality of wavy N-doping regions and the plurality of wavy P-doping regions are sandwiched by a pair of side doping regions extending in the second direction;
   wherein either each of the plurality of wavy N-doping regions or each of the plurality of wavy P-doping regions is connected to the pair of side doping regions.

2. The diode structure of claim 1, wherein when each of the plurality of wavy N-doping regions is connected to the pair of side doping regions, the pair of side doping regions are N-doped.

3. The diode structure of claim 1, wherein when each of the plurality of wavy P-doping regions is connected to the pair of side doping regions, the pair of side doping regions are P-doped.

4. The diode structure of claim 1, wherein the N-doping widths and the P-doping widths are essentially identical.

5. The diode structure of claim 1, wherein the plurality of wavy N-doping regions and the plurality of wavy P-doping regions are arranged in an alternating manner in the second direction.

6. The diode structure of claim 1, further comprising a plurality of shallow trench isolations (STI) formed between the plurality of wavy N-doping regions and the plurality of wavy P-doping regions.

7. The diode structure of claim 1, further comprising an N well located above the P-type substrate and beneath the plurality of wavy N-doping regions and beneath the plurality of wavy P-doping regions.

8. The diode structure of claim 7, further comprising a deep N well located above the P-type substrate and beneath the N well.

9. The diode structure of claim 8, wherein the N well is highly doped compared with the deep N well.

10. An electrostatic discharge (ESD) protection circuit, comprising:
    the diode structure of claim 1;
    an input/output terminal of a circuit under protection electrically connected to a first wavy P-doping region and a first wavy N-doping region;
    a first node electrically connected to a second wavy N-doping region; and
    a second node electrically connected to a second wavy P-doping region.

11. The ESD protection circuit of claim 10, wherein the first node is a positive power node and wherein the first wavy P-doping region and the second wavy N-doping region constitute a PN ESD diode.

12. The ESD protection circuit of claim 10, wherein the second node is a negative power node and wherein the first wavy N-doping region and the second wavy P-doping region constitute an NP ESD diode.

13. The ESD protection circuit of claim 10, wherein the plurality of wavy N-doping regions and the plurality of wavy P-doping regions are sandwiched by a pair of side doping regions extending in the second direction.

14. The ESD protection circuit of claim 11, wherein the plurality of wavy N-doping regions are connected to the pair of side doping regions, and wherein the pair of side doping regions are N-doped.

15. The ESD protection circuit of claim 11, wherein the plurality of wavy P-doping regions are connected to the pair of side doping regions, and wherein the pair of side doping regions are P-doped.

16. The ESD protection circuit of claim 10, wherein the N-doping widths and the P-doping widths are essentially identical.

17. The ESD protection circuit of claim 10, wherein the plurality of wavy N-doping regions and the plurality of wavy P-doping regions are arranged in an alternating manner in the second direction.

18. The ESD protection circuit diode structure of claim 10, wherein the diode structure further comprises a plurality of shallow trench isolations (STI) formed between the plurality of wavy N-doping regions and the plurality of wavy P-doping regions.

19. The ESD protection circuit of claim 10, wherein the diode structure further comprises an N well located above the P-type substrate and beneath the plurality of wavy N-doping regions and beneath the plurality of wavy P-doping regions.

20. The ESD protection circuit of claim 17, wherein the diode structure further comprises a deep N well located above the P-type substrate and beneath the N well.

21. The ESD protection circuit of claim 18, wherein the N well is highly doped compared with the deep N well.

* * * * *